United States Patent
Benson, Jr. et al.

(10) Patent No.: US 6,172,876 B1
(45) Date of Patent: Jan. 9, 2001

(54) MODULAR I/O ASSEMBLY SYSTEM

(75) Inventors: Richard E. Benson, Jr., Mentor, OH (US); Thomas H. Burchard, Winchester; Youngminh Kim, Lexington, both of MA (US); Donald L. Oros, Gates Mills; David S. Priscak, Lakewood, both of OH (US); Arthur Rousmaniere, Andover, MA (US)

(73) Assignee: Elsag International N.V. (NL)

( * ) Notice: Under 35 U.S.C. 154(b), the term of this patent shall be extended for 0 days.

(21) Appl. No.: 09/439,722

(22) Filed: Nov. 12, 1999

Related U.S. Application Data

(62) Division of application No. 08/970,641, filed on Nov. 14, 1997.

(51) Int. Cl.[7] .............................. H05K 5/00; H05K 5/04; H05K 5/06
(52) U.S. Cl. ......................... 361/753; 361/826; 361/827; 361/749; 361/753; 361/788; 361/616; 312/223.2
(58) Field of Search ................................... 361/724, 725, 361/726, 749, 753, 788, 616, 686, 826, 827; 312/223.2

(56) References Cited

U.S. PATENT DOCUMENTS

| | | | |
|---|---|---|---|
| 5,507,650 | * 4/1996 | Larabell | 439/61 |
| 5,680,295 | * 10/1997 | Le et al. | 361/695 |
| 5,682,290 | * 10/1997 | Markow et al. | 361/683 |
| 5,967,633 | * 10/1999 | Jung | 312/223.2 |
| 6,018,456 | * 1/2000 | Young et al. | 361/684 |

* cited by examiner

Primary Examiner—Leo P. Picard
Assistant Examiner—Tung Minh Bui
(74) Attorney, Agent, or Firm—Vytas R. Matas

(57) ABSTRACT

A unique cabinet mounted I/O assembly adapted for integration into a control system which allows a block I/O assembly to be mounted in both sides of the cabinet allowing a blind fit of power and signal connections insuring that power will be provided to the block I/O assembly before any application of signals thereto and preventing any mismatching of I/O units to wrong processor blocks in the cabinet by a color matching scheme.

10 Claims, 16 Drawing Sheets

FIG. 6
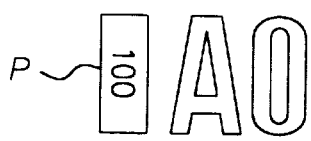
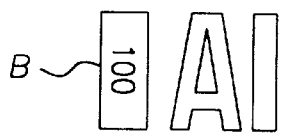
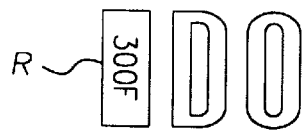
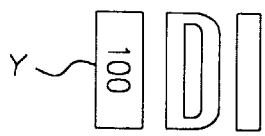
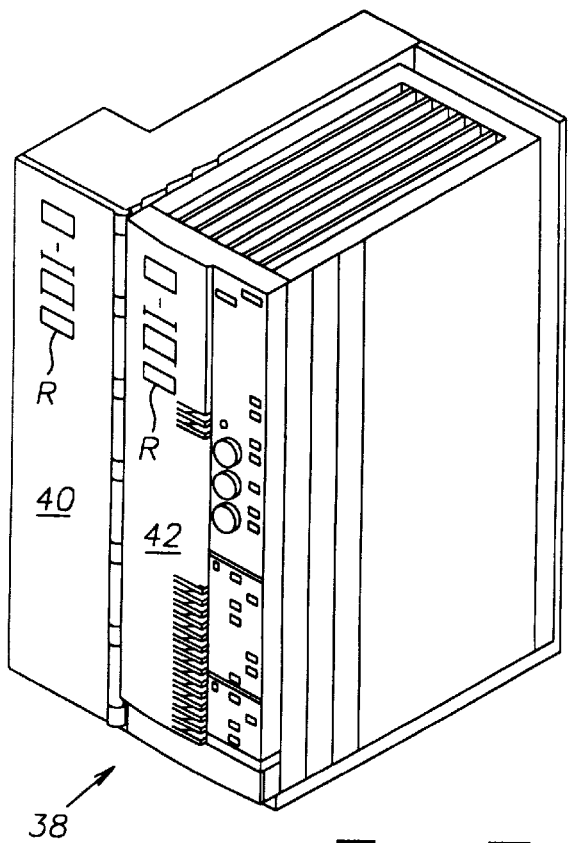
FIG. 7

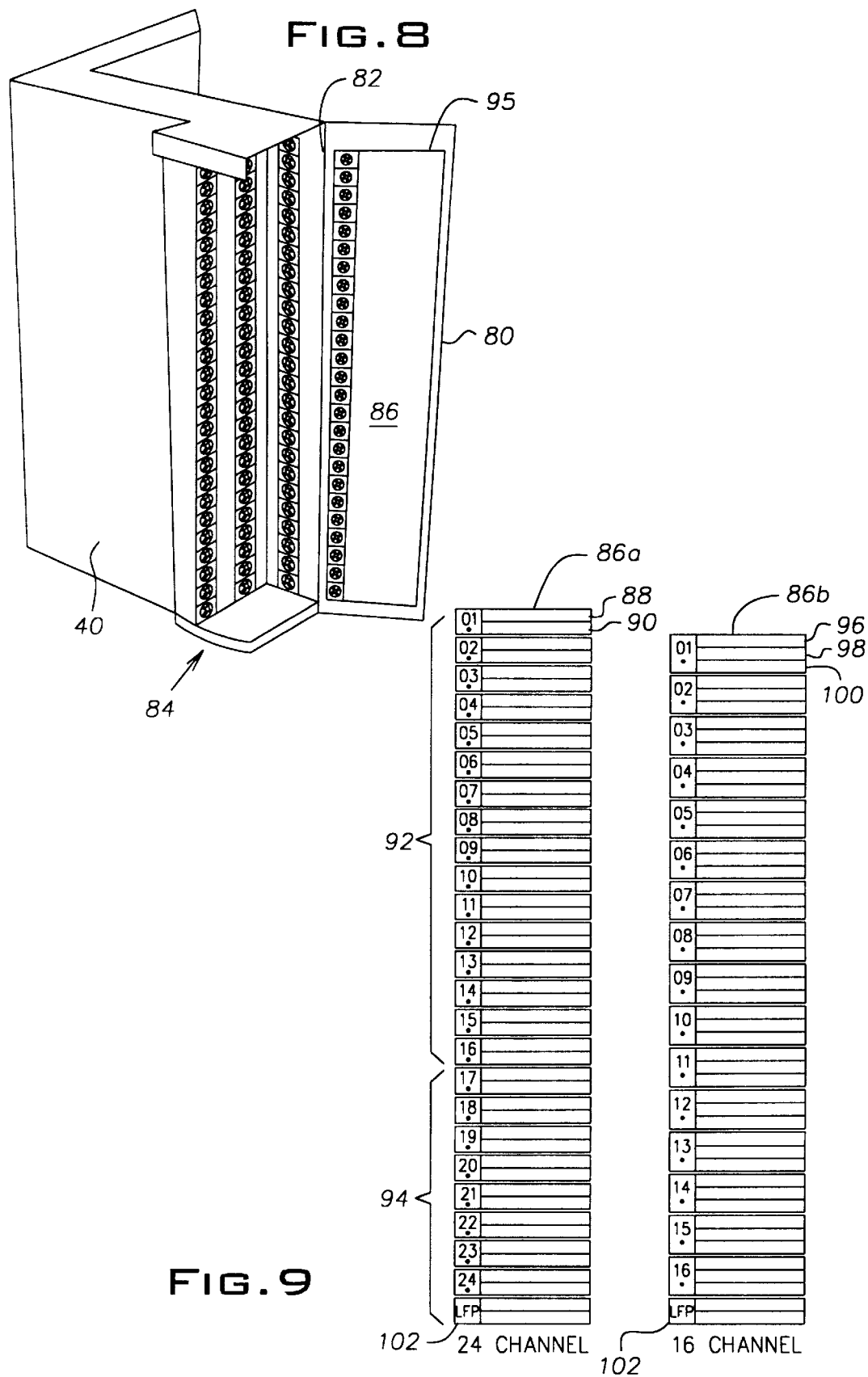

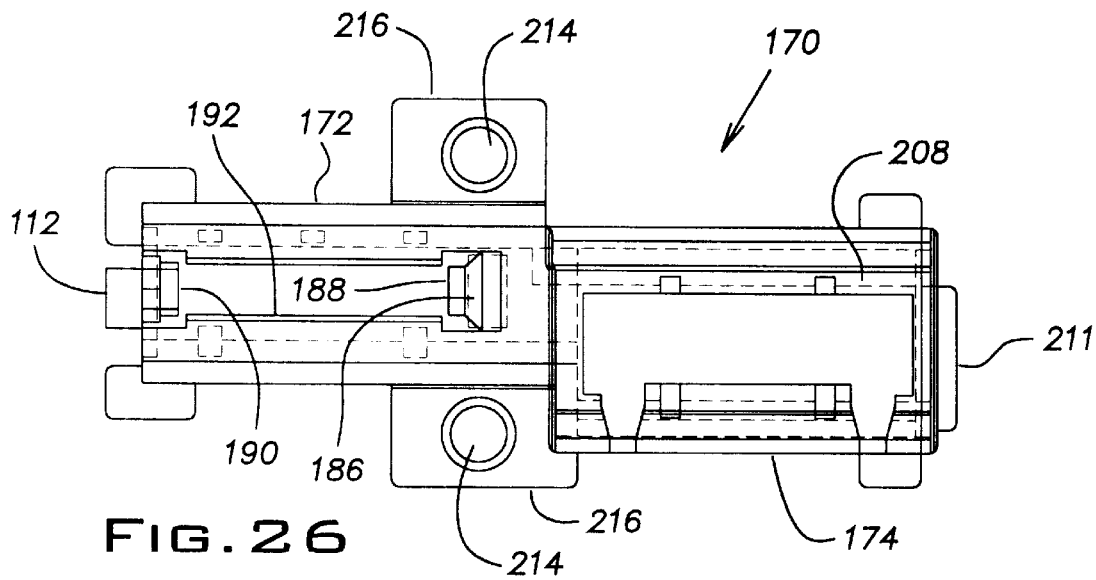
FIG. 26
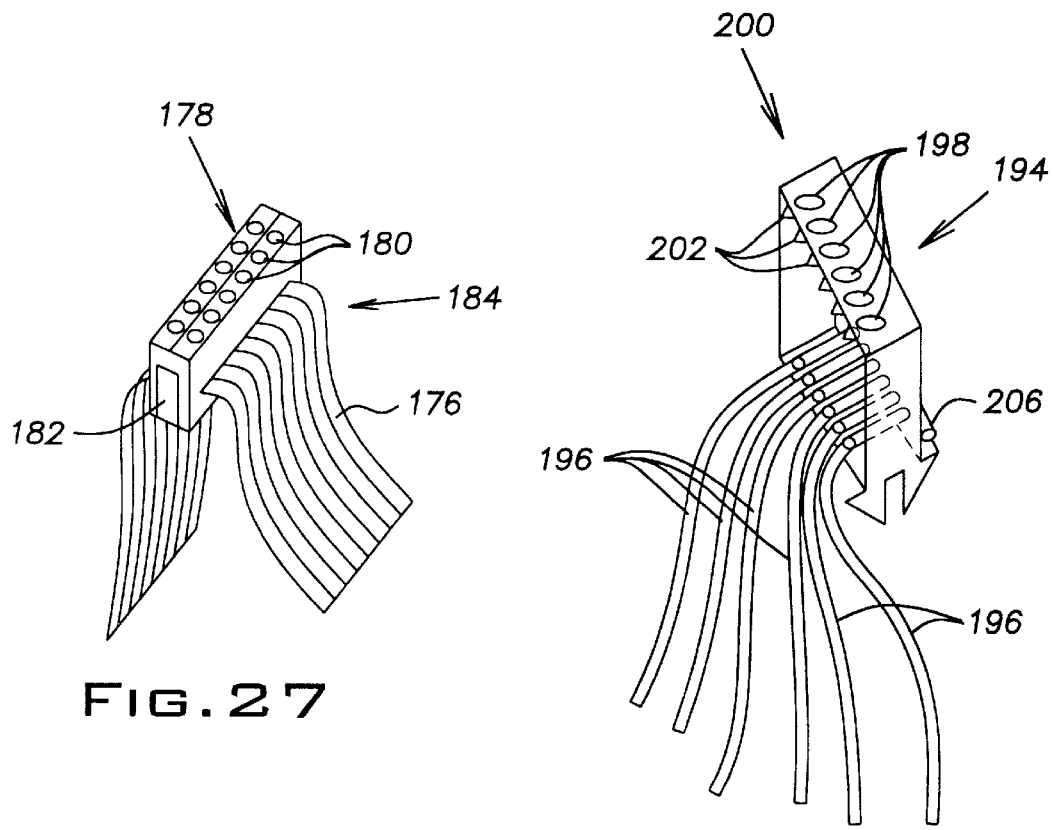
FIG. 27
FIG. 28

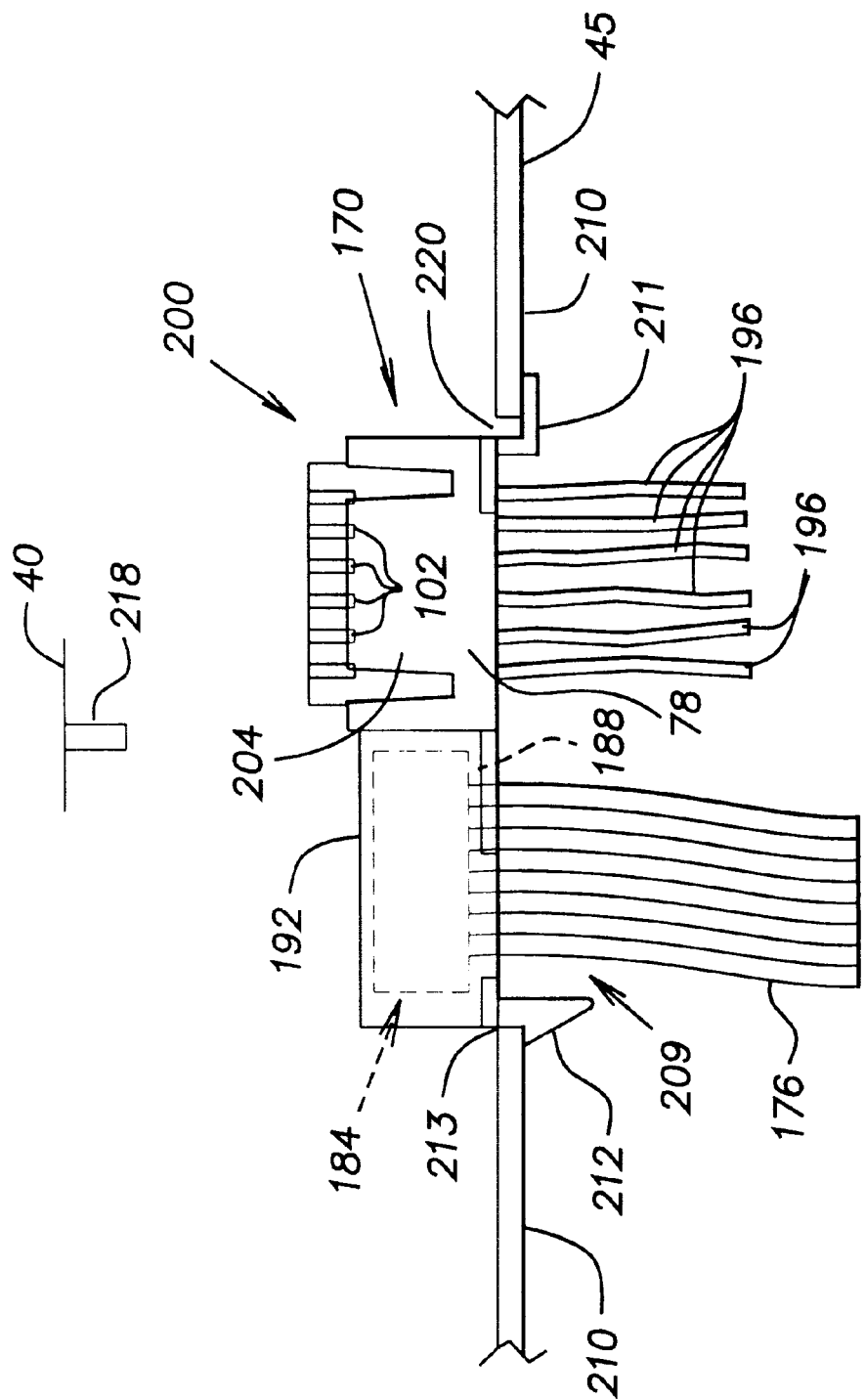

MODULAR I/O ASSEMBLY SYSTEM

This application is a division of Ser. No. 08/970,641 filed Nov. 14, 1997.

BACKGROUND OF THE INVENTION

1. Field of the Invention

The present invention relates generally to modular I/O electrical assemblies and more particularly to methods and devices for connecting I/O blocks into an I/O cabinet designed for containing a plurality of such blocks making the cabinet suitable for connection into a control system as one element thereof.

2. Description of the Prior Art

The prior art I/O cabinetry had block assemblies mounted therein which depended upon markings on the assemblies to insure a proper assembly of the I/O unit to its matching signal and power source in an I/O block cabinet having one side entry thereto. This caused some units to be damaged when they were connected in an improper sequence. Further, these connections were blind in some I/O modules making this sequencing a matter of guesswork. These blind connections were sometimes impossible when there was nonalignment of the I/O module and the power and signal connectors caused by tolerance buildup during the assembly of the case.

In prior art systems requiring the assembly of individual parts into a system or element of that system a schematic along with an instructional booklet is used. Such a procedure becomes especially burdensome when you begin assembly of electronic control systems such as block I/O cabinetry. These systems first require the assembly of processor blocks and I/O modules into an I/O assembly according to appropriately co-ordinated identical module functions and a further co-ordination of these modules having the same function for identical type of signal input. As an example, identical digital input-output processor blocks for temperature signals could be mismatched with digital input-output I/O modules for line voltage or pressure signals. The result would be at the least an inoperative system.

Similar problems occur in field wiring the processor blocks of I/O modules which can have up to 24 channels which require specific input or output signals co-oordinated to the I/O block which must be not only identified as inputs or outputs but must also be the right type of inputs or outputs as was explained above.

Thus an easily accessible I/O cabinet was needed which would provide easy access and mounting of I/O component modules from both sides of the cabinet and which allowed easy and foolproof assembly of such modules into the cabinet while preventing the application of signal inputs to the I/O modules before power was connected to the modules as well as providing such a sequential connection using a blind fit into an I/O module mounting area in the cabinetry.

BRIEF SUMMARY OF THE INVENTION

The present invention solves the problems associated with prior art devices and others by providing a uniquely designed I/O module mounting cabinet having modules mounted on both sides thereof as well as unique modules which are made in two sections and are color coded for foolproof mounting in said cabinet to insure the proper electrical mount of I/O modules in the cabinet. The modules are also electrically connected therein so that power is first connected to the block I/O unit before any signal connections are made. Also, this connection is made to be a loose fit in the cabinet wall to allow any slight misalignment due to tolerance buildup to be compensated for when the individual units are mated.

In view of the foregoing it will be seen that one aspect of the present invention is to provide an I/O module mounting cabinet which allows correct mounting of color coded modules on both sides of the cabinet Another aspect of the present invention is to provide an I/O module mounting cabinet which allows blind mating of a block I/O unit to a cabinet having power and signal connections for the I/O unit.

Another aspect of the present invention is to provide an I/O module mounting cabinet which allows the block I/O unit to be electrically connected in the cabinet insuring proper sequencing of power and signal connections.

These and other aspects of the present invention will be more fully understood after a review of the following description of the preferred embodiment when considered with the accompanying drawings.

BRIEF DESCRIPTION OF THE DRAWINGS

FIG. 6. is a table of abbreviations for various types of I/O modules and color codes for each of these types.

FIG. 7. is a perspective view of the combined processor block showing the color code and functions representation on matching connector base and I/O module making up the processor block FIG. 8. is a perspective view of the processor block with its door open to reveal the field wiring connections.

FIG. 9. is a front view of a scratch pad label found on the inside of the processor block door of FIG. 8.

FIG. 26. is a top view of the connector shown in FIGS. 24 and 25.

FIG. 27. is a perspective view of a ribbon signal connector which fits into the holder shown in FIGS. 24–26.

FIG. 28. is a perspective view of a power connector which fits into the holder shown in FIGS. 24–26.

FIG. 29. is a side view of the electrical connector of the present invention shown having the power and signal connectors fitted therein shown mounted in a cabinet wall allowing alignment pins on the block I/O connector base to grossly align the holder for mating with the I/O block

DETAILED DESCRIPTION OF THE PREFERRED EMBODIMENT

Figure 1:
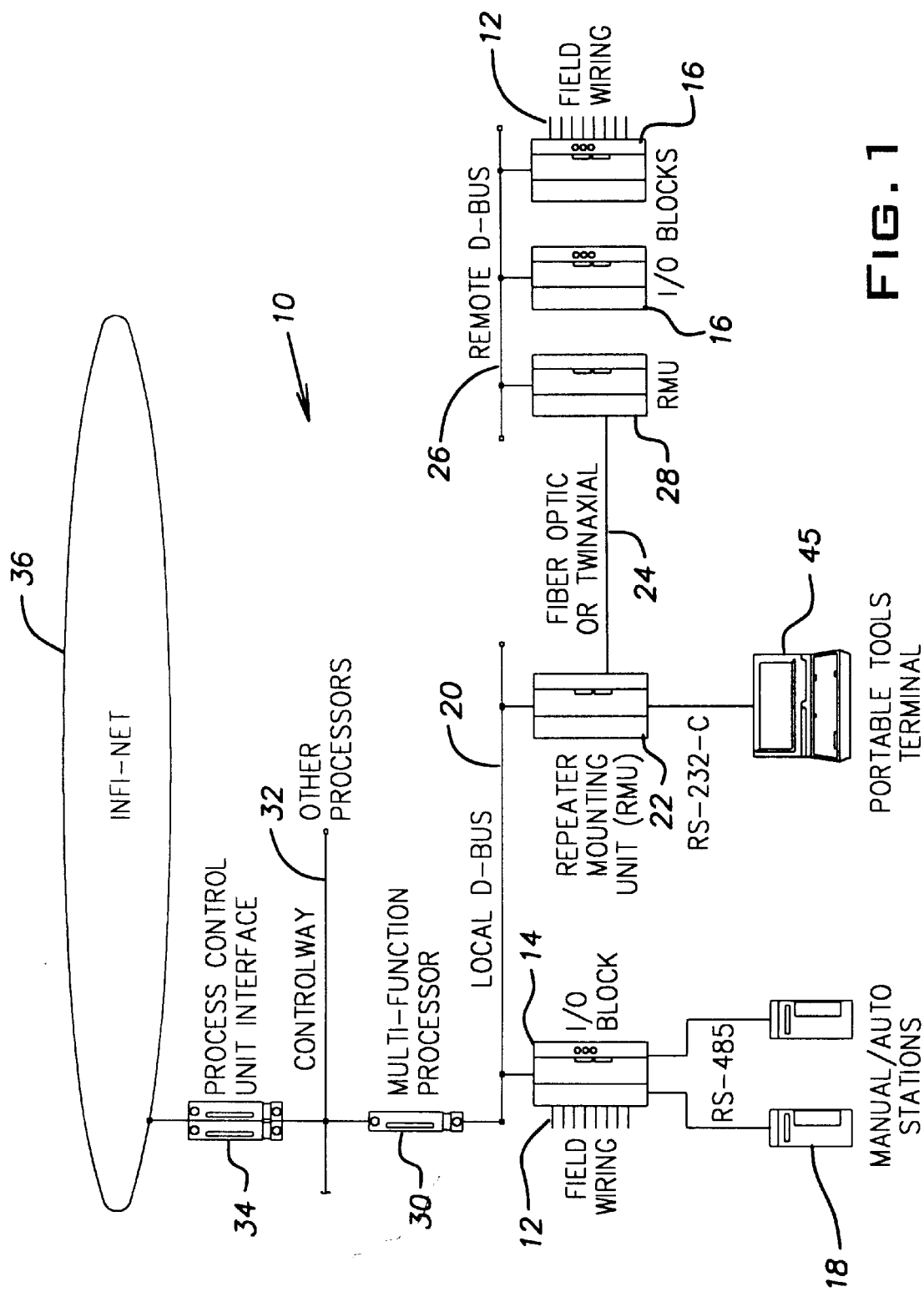
FIG. 1. is a schematic of a distributed process control system using the block I/O system cabinetry of the present invention.

Referring now to the drawings where the showings are intended to describe preferred embodiment of the invention and not to limit it thereto, FIG. 1 shows a distributed process control system 10. Process signals are inputted along field wiring lines 12 to a series of local and remote I/O blocs 14, 16. Any of these blocks could be connected to manual/auto stations 18 for allowing operator control of the signals. Since the local D-bus 20 is relatively short (around 50 /meters) a repeater mounting unit 22 (RMU) is connected to the local I/O block for conditioning the signal so it may be transmitted by either fiber optic or twinaxial cable 24 to a remotely located D-bus 26 by way of a second RMU 28 for reconditioning the signal transmitted by the first RMU so it is readable by the I/O blocks 16 connected to the remote D-bus.

The various process control signals collected along the local and remote D-bus 20, 26 are connected to a multi function control processor 30. Other processors may be also, connected to these D-buses and their control signals along with that of the processor 30 connected to a controlway 32 which sends the signals to a process control unit 34 for conditioning these signals for use by a control room process unit such as the Elsag Bailey INFI - NET process control system 36.

Figure 2:
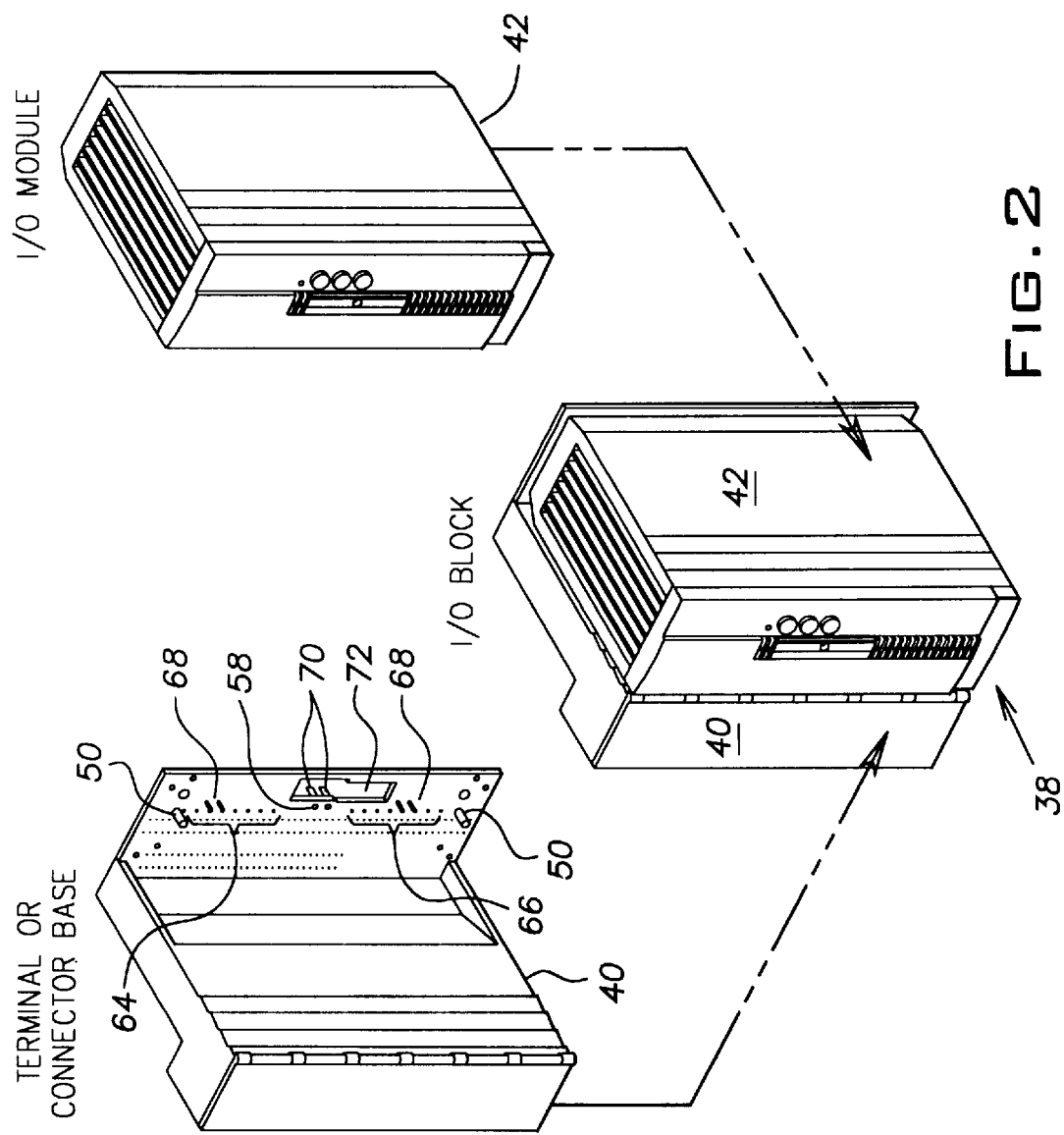
FIG. 2. depicts a block I/O assembly and the connector base and I/O module comprising same.
Figure 3:
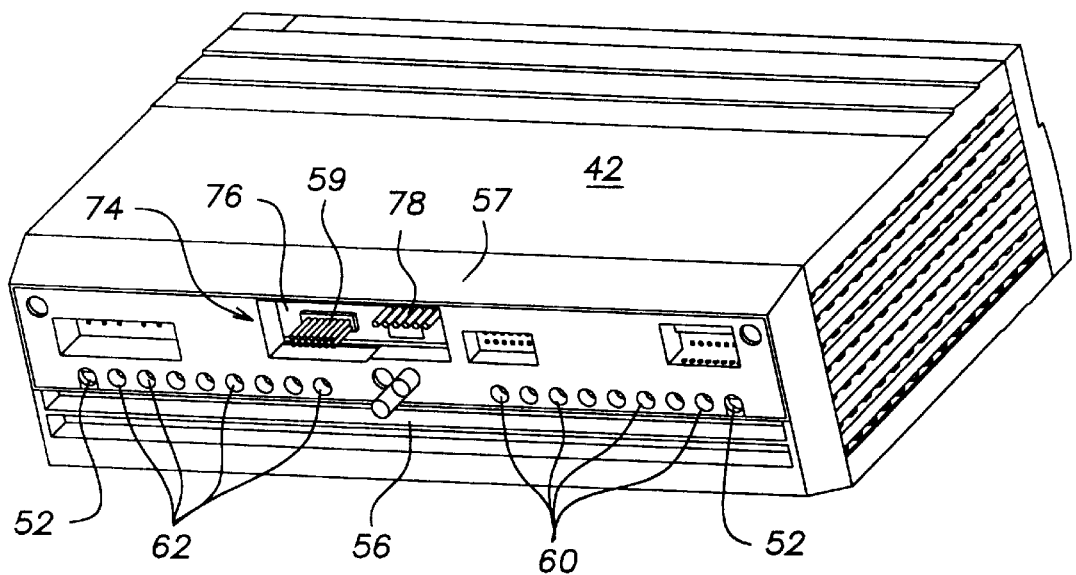
FIG. 3. is a rear view of the I/O module showing the general pattern of holes found therein for orienting plugs therein according to an identifying pattern.
Figure 4:
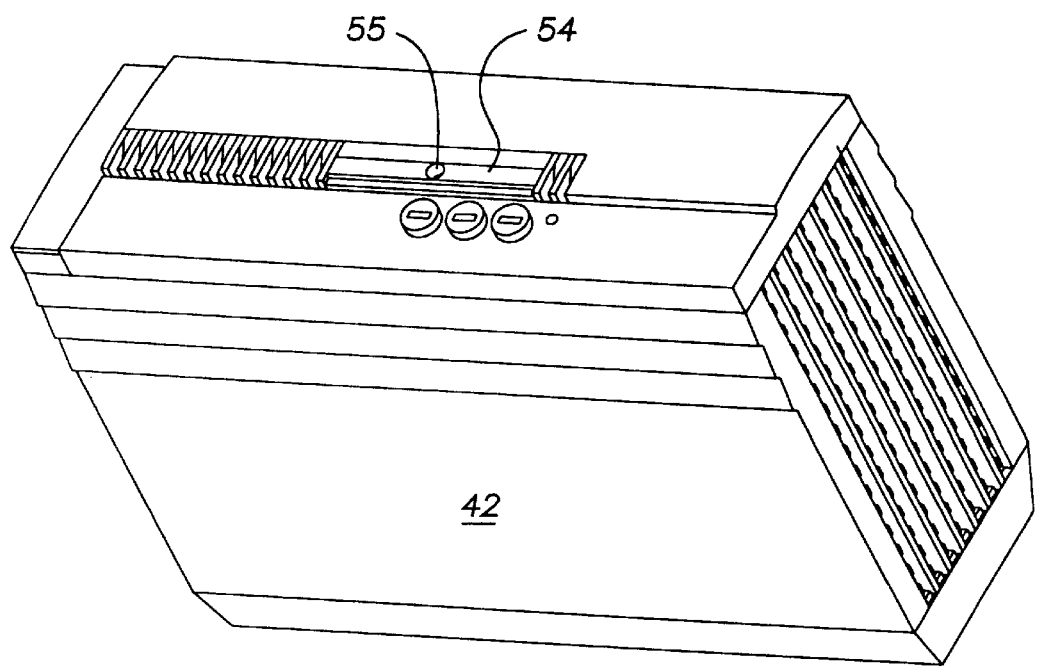
FIG. 4. is a front view of the I/O module.
Figure 5:
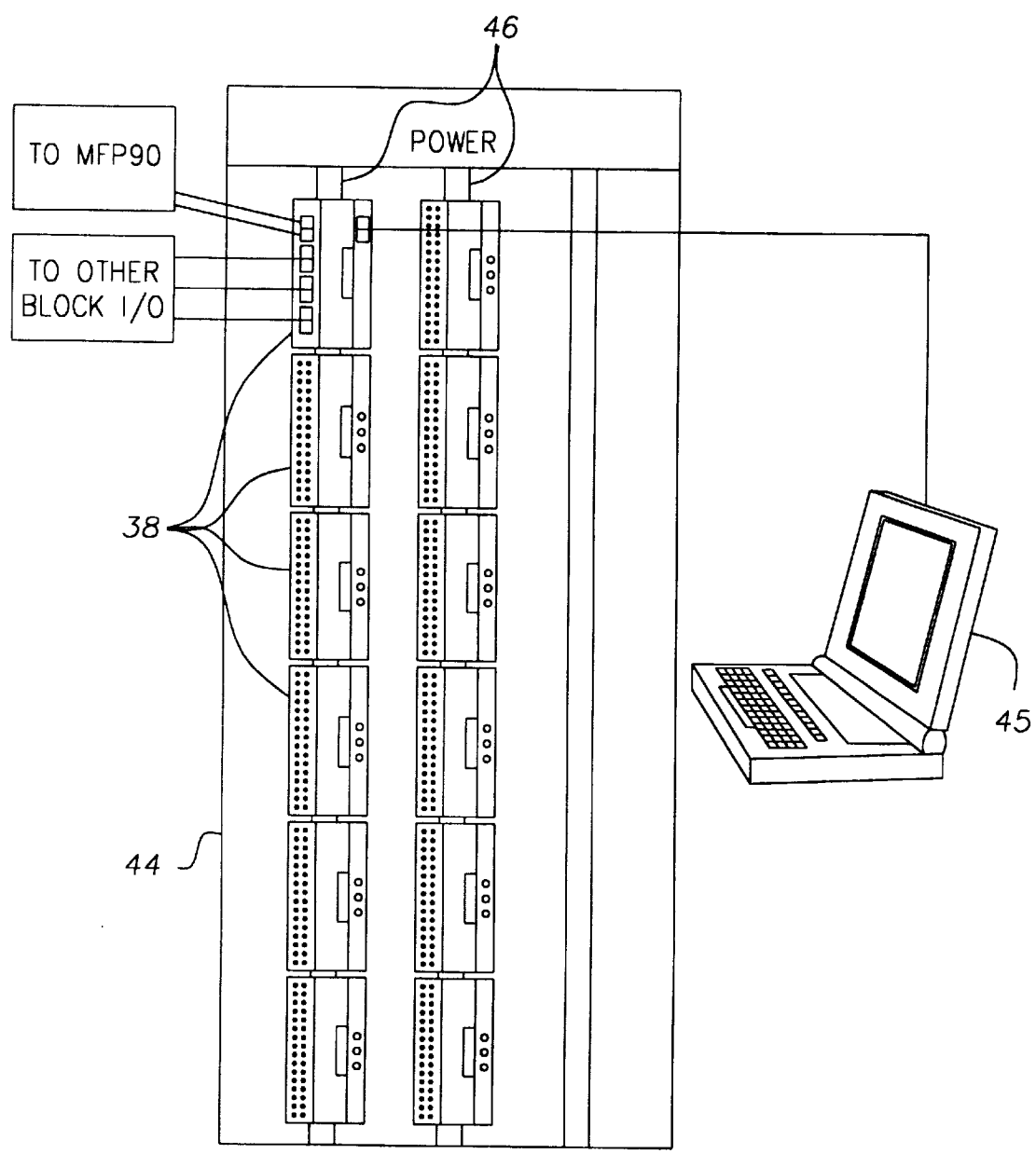
FIG. 5. is a front of a control cabinet having a plurality of I/O module assemblies connected therein.

As is shown in FIGS. 2–4, processor block or the basic I/O block 38 is made up of a terminal block or connector base 40 which serves all these functions and will be referred to herein according to the function being discussed and a I/O module 42. The Processor Block is the front line controller which houses the electronic and configuration boards. The Terminal Block is used to terminate all field wires and route their signals back to the Processor Block. Each block 38 is specifically programmed or configured for a specific function and is mounted into a cabinet 44 best seen in FIG. 5. The individual block I/O's 38 are connected to communicate with each other in the Cabinet 44 as well as providing local access through a laptop computers 45.

The connector base 40 is mounted in a known manner such as by screws or clips to a conductive column 46 found in the cabinet 44 which provides power to the base 40 and 10 therefrom to the assembled I/O blocks 38 as well as providing communication there between. The I/O module 42-s connected to the base 40 by pushing it onto guide pins 50 found on the back of the I/O module 42 as seen in FIG. 3. The module 42 is then locked to the base 40 by pushing a lock handle 54 to extend and lock the mechanism 56 into the base aperture 58.

Each individual I/O block 38 is programmed for a specific function and it is imperative to make sure that the proper module 42 is inserted into the proper base. To insure this ability the base and module are specifically configured to prevent the mating of a module with other than its properly connected base.

As best seen in FIGS. 3–4, this is accomplished by either upper and lower holes 60, 62 on the back of the module 42 which are alignable through the pegs 50 on the base 40 with complimentary eight upper and lower holes 60, 62 on the base 40 matching pins 68.

There are presently 12 different I/O modules being used. The existing I/O block are identified by the 30 following code:

I=Input
O=Output
D=Digital
A=Analog
C=Control

These codes are combined into various combinations some of which may be seen in FIG. 6. You would then read these combinations as analog output for AO, analog input for AI, control input-output for CI-O, digital input-output for DI-O, digital output for DO and digital input for DI.

As best seen in FIG. 5 and FIGS. 20–23, the conductive column 46 has 10, known connectors (not shown) mounted into openings formed in the cabinet 44 which provide power and signal connections 64 and 66 respectively from the cabinet 44 to the I/O module 42. A pair of alignment pins 50 found on the back of the I/O base or connector unit 40. When the unit 40 is mounted in the cabinet 44 the alignment pins 50 align the I/O unit through an opening 52 formed therein. An opening 72 matches an opening 74 found on the back of the I/O module 42 which has individual clustered power and signal pins 76, 78 which mate with an appropriate known power and signal assembly (not shown) the power pins 78 on the I/O module 42 will be electrically connected to the cabinet 44 before any signal pins 76 are connected to the cabinet by the proper mounting of the module 42 to the connector 40 into the I/O block assembly 38.

Since the present system 10 requires six different processor block 38 categories, six different colors were chosen to represent each category. Thus FIG. 6. shows a purple color bar P, a blue color bar B, a green color bar G, an orange color bar O, a red color bar R, and a yellow color bar Y as representing each of these six categories. It will be understood that any of these color bars could proceed any of the previously described functional representations shown in FIG. 6., in addition to the ones shown.

As may be seen in FIG. 7., the I/O block 38 is thus easily matched to have the appropriate terminal block 40 and I/O module 42 by checking the logo and color bar on both for an identical match. Thus the terminal 40 which as a orange O color bar and digital input-output functional representation DI-O is properly matched only with an I/O module 42 having a red R color bar and digital input-output DI-O representation stamped on each element 40, 42. This identification utilizes a family approach to identification, and as other blocks are added to the system they will follow the same design approach.

As is best seen in FIG. 8, the processor block 40 has a door 80 which is supported by hinges 82 to show a plurality of field wiring connectors 84 found therein.

A scratch pad label 86 is located inside the hinged door 80 of the Terminal-Block. Its purpose is to both identify the specific wire numbers for each field wiring channel and differentiate between input and output channels. As best seen in FIG. 9. the scratch pad 86 may have either 24 channels or 16 channels 86a, 86b depending on the installation. The scratch pad 86(a) provides two areas 88,90 next to each channel where the wire information can be written on to the label. The information on this label 86 (a) is written on by the user at the site. To simplify this procedure, the door 80 swings open 180 degrees and is supported by the Processor Block 42. In the case of blocks where input 92 and output 94 channels are available, the label 86(a) has been color coded accordingly to the previously described color scheme for each channel and identified with "I"s and "O"s to simplify the wiring of these blocks. This label is manufactured by silk screening on paper stock with an adhesive layer on the back It is located in place by a small recess 95 in the door 80. The 16 channel scratch pad 86(b) provides 3 areas 96,98,100 next to each channel where 3 wire installation information is written in by the user. Each scratch pad 86(a), 86 (b) has an individually labeled field power connection 102.

Figure 10:
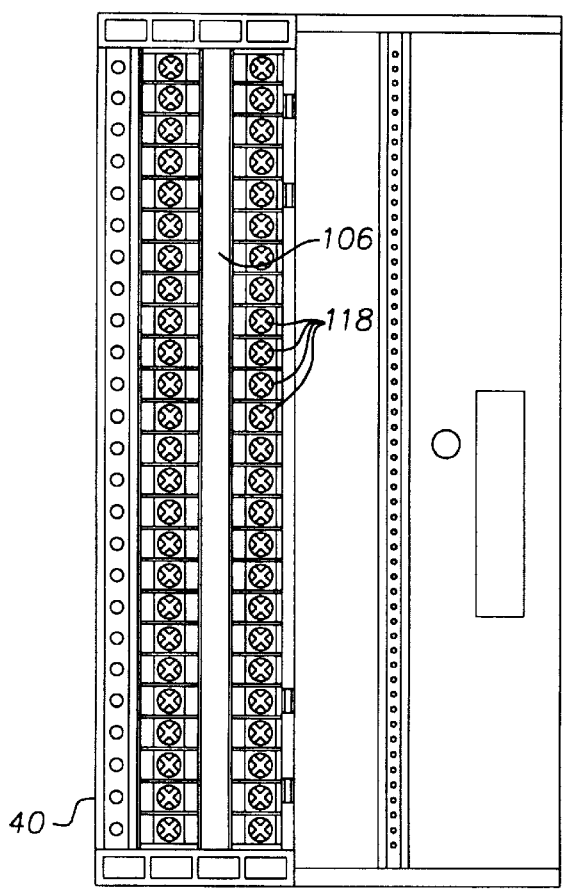
FIG. 10. is a front view of the processor block showing the field wiring channels found therein.
Figure 11:
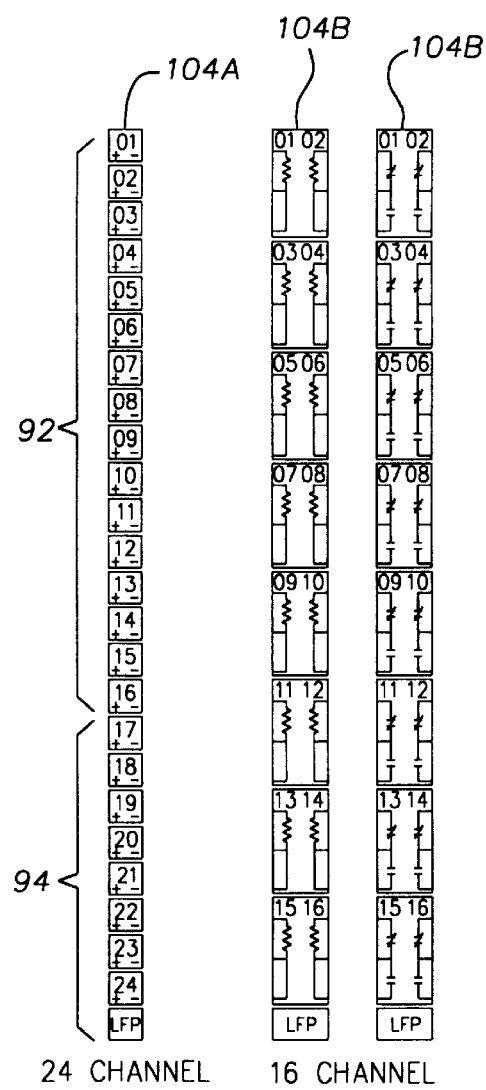
FIG. 11. is a depiction of the labels locatable in a recess between the individual channel connections, identifying the channel number and color code.

As best seen in FIGS. 10. and 11., each field wired channel is physically identified by a label 104 which is mounted on the barrier strip 106 of the Terminal Block 40. Each channel is individually identified by labels 104(a) and 104(b) for both 16 and 24 channel versions both of which including one for field power. In the case of the input-output blocks 92,94 the channel identification label has been similarly color coded though they are not identified with "I"s and "O"s due to space constraints. These labels are manufactured by reverse silk screening on clear plastic with an adhesive layer on the back. They are located in place by a small recess in the plastic barrier strip 106.

Figure 12:
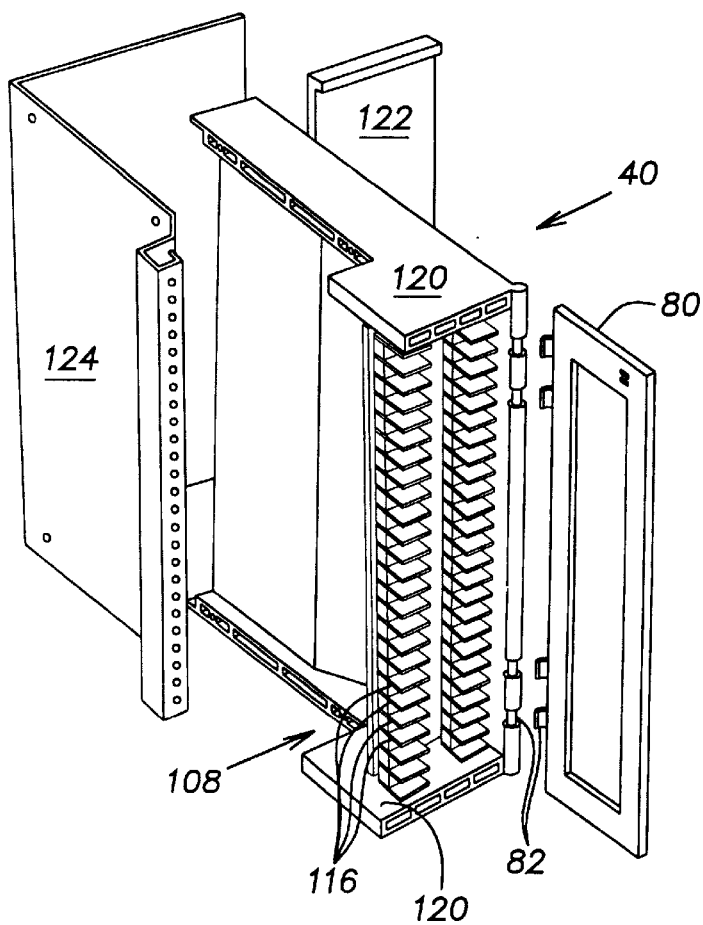
FIG. 12. is a disassembled view of the elements of the processor or block of FIG. 8.

Turning next to FIG. 12 it is seen that the terminal block 40 is assembled from the following list of parts and their fabrication method:

| Number of parts | Part Description | Process & Material |
| --- | --- | --- |
| 1 | Terminal strip housing | Injection molded plastic |
| 1 | Backplane cover | Injection molded plastic |
| 1 | Door | Injection molded plastic |
| 1 | Ground plate | Plated sheet steel |
| 1 | Scratch pad label | Silk screened paper stock with adhesive |
| 1 | Channel ID label | Reverse silk screened Lexan |

Figure 13:
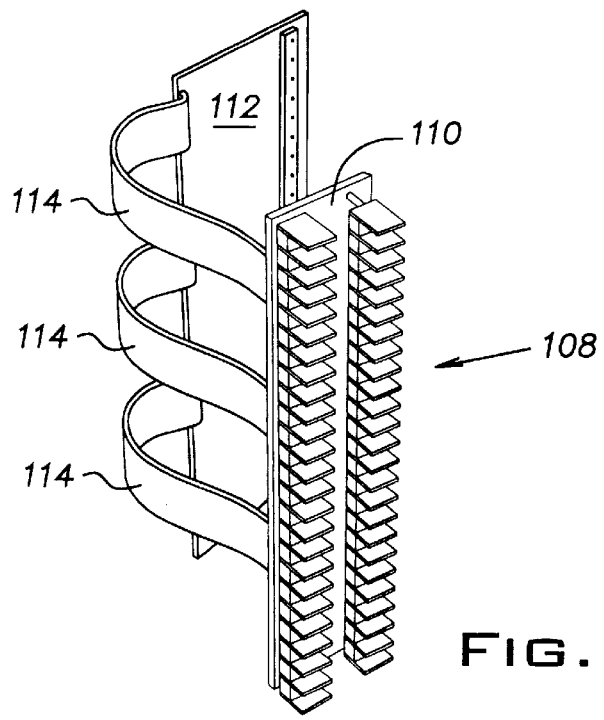
FIG. 13. is an expanded view of the ribbon electrical connection of FIG. 12.
Figure 14:
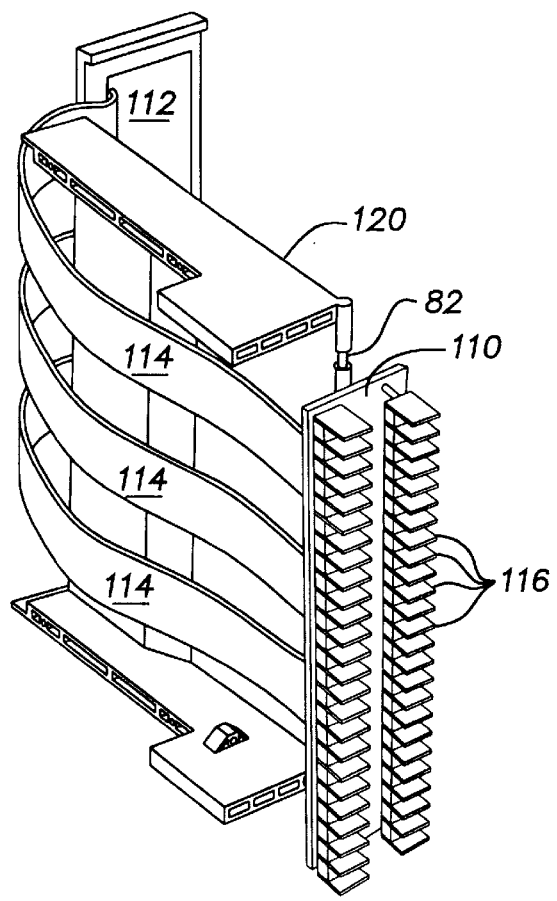
FIG. 14. shows the assembled relationship of the connectors of FIG. 13 to the FIG. 12 assembly.
Figure 15:
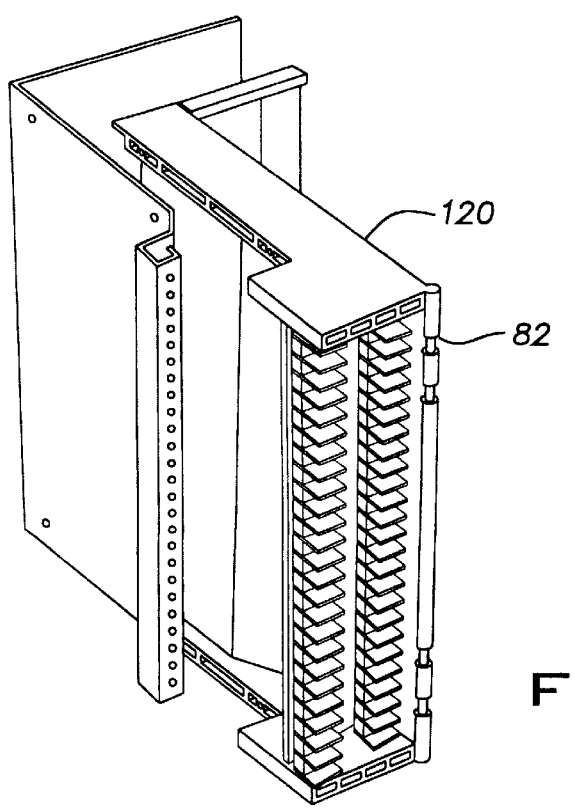
FIG. 15. shows the ground plate of the FIG. 12 assembly.
Figure 16:
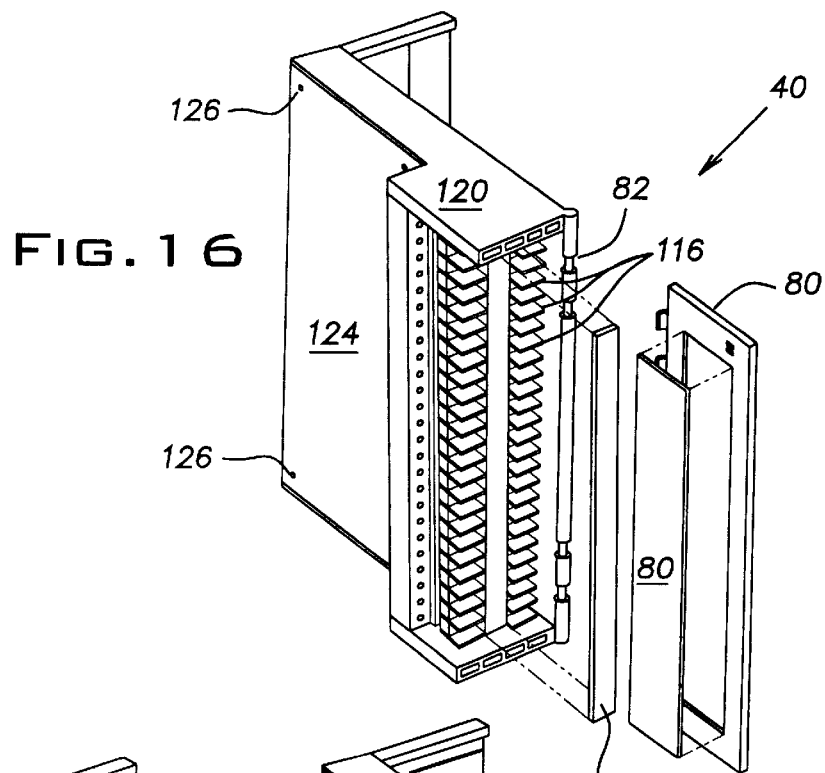
FIG. 16. shows the assembly of the door and channel identification to the FIG. 12 assembly.

As seen in FIG. 13 a ribbon cable assembly 108 has a pair of boards 110; 112 attached by an electrical cable 114. The ribbon cable 114 brings the connected board 112 to the front of the unit 40 to allow easy user access. The board 110 has electrical connector parts 116 which are connected electrically to the field wiring screws 118 seen in FIG. 10. The board 110 is snapped into a housing 120 and the board into a backplane cover 122 as best seen in FIGS. 12–13.

With the circuit boards 110, 112 securely in place, a sheet metal ground plate 124 is attached to the plastic housing 120. This metal part initially snaps to the plastic housing 120 and is then further secured with screws 126. The ground plate 124 serves three primary functions in the Terminal Block 40. First and foremost, the metal plate is a bus bar for all ground wires requiring termination to chassis ground. Secondly, it provides the main structure for the Terminal Block itself. This block configuration allows a recess under the terminal strips creating more room for the wiring channel. Lastly, the metal plate 124 protects the ribbon cable 114 that runs from one board to the other. In effect, it traps the cable between the metal and the plastic, eliminating any chance of damage that might occur when installing field wires.

Figure 17:
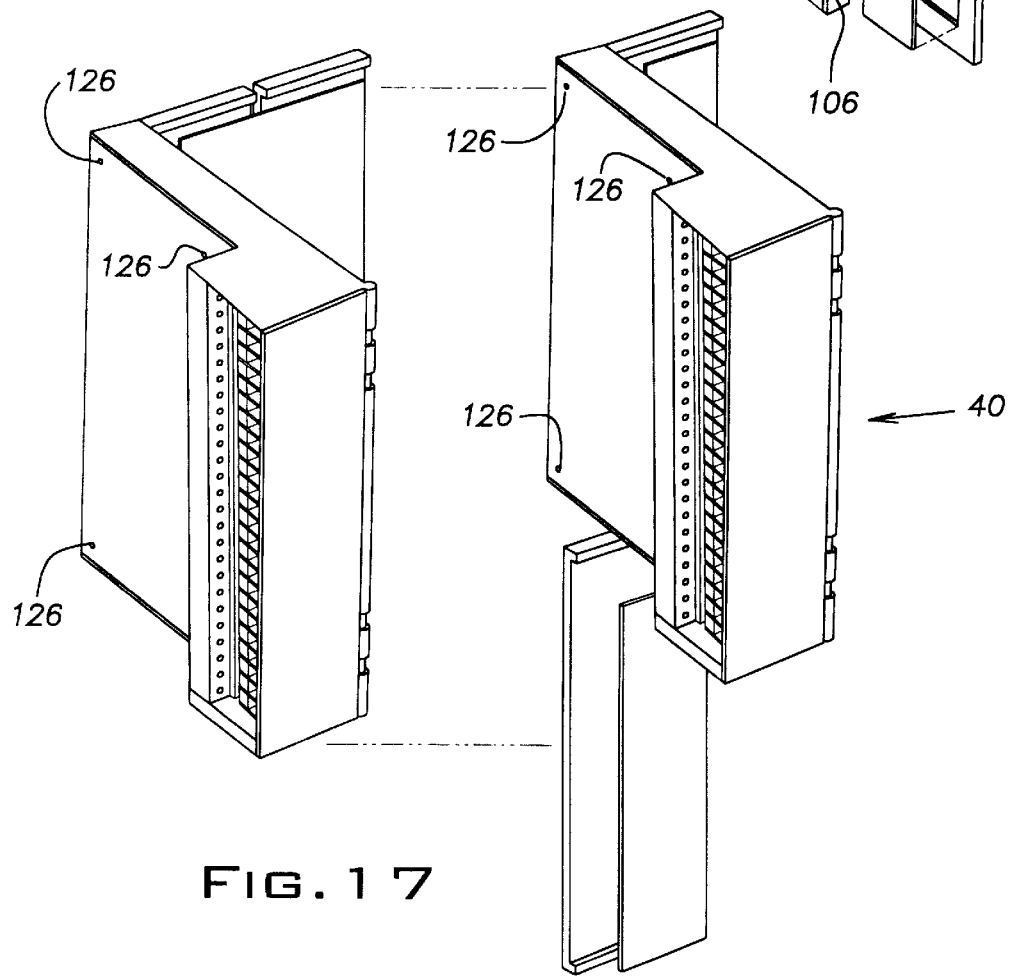
FIG. 17. shows terminal redundancy in two processor blocks.

As best seen in FIG. 17 horizontal redundancy can be easily achieved with the use of two of the backplane covers snapped to one another. The only new part or addition is the boards required to achieve this application.

Vertical redundancy is achieved by placing another termination assembly directly above or below the primary block The two Terminal Blocks are ton attached by a connector that allows them to share the same field signals.

Figure 18:
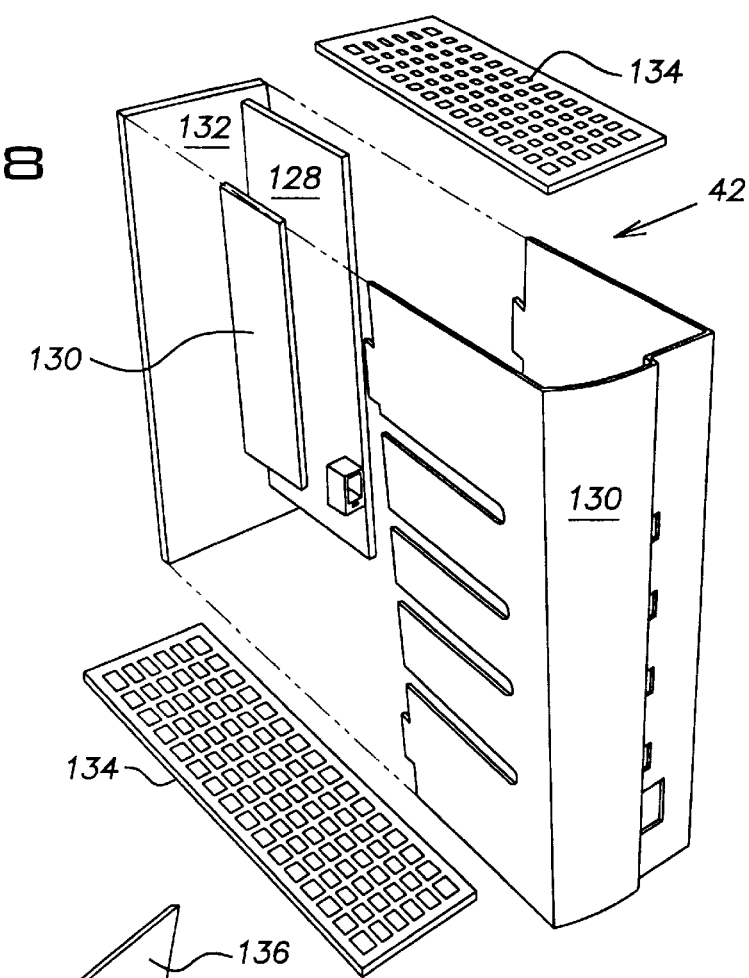
FIG. 18. shows the internal elements of the block I/O unit of FIGS. 2–4.
Figure 19:
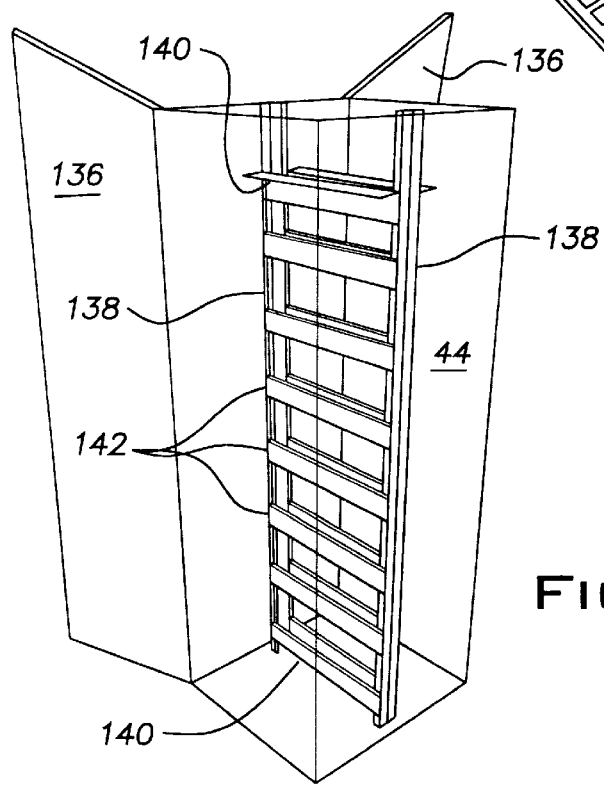
FIG. 19. is a perspective view of the system cabinet of FIG. 5. with horizontal supports.
Figure 20:
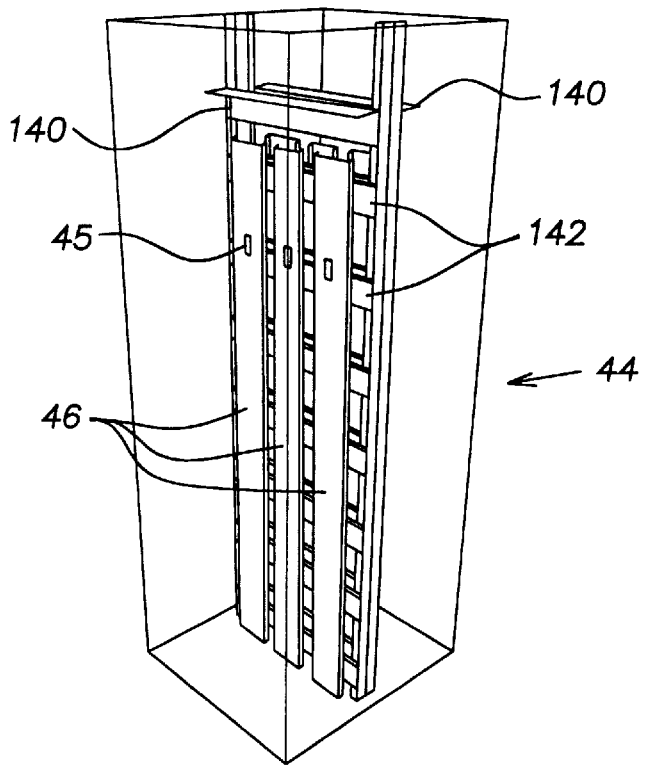
FIG. 20. shows the FIG. 19 cabinet with mounting columns added thereto.

Referring now to FIG. 18 it will be seen that the I/O unit 42 provides the main interface between the blocks assemblies and the main operating system. The unit 42 consist of a processor board 128 and an I/O board 130 that provide communication both in and out of the cabinet 44. It has a simple side cover 130 that snaps into place in a wall plate 132 to hold the boards 128 and 130 there between and has a top and bottom grille 134 which ducts air from the block below to the block above it.

Turning next to the cabinet 44, the assembly thereof, and the placement of the terminal block 40 and I/O blocks 42 therein; FIGS. 19–23 show the cabinet 44 having access doors 136 at both ends thereof. A pair of centrally located vertical channels 138 are mounted inside the cabinet 44.

Horizontal Supports 140 is located along the top and the bottom of vertical channel 138. Some additional Supports 142 are also located in the middle for structural support The system is designed to accommodate up to one Support 142 per I/O Block height With particular reference to FIG. 20. it will be seen that three columns 46 made from punched and bent sheet metal and finished with Zinc plating are connected to the supports 142.

These columns serve as the fundamental mounting element for the I/O Blocks. Power and communications are distributed to the I/O Blocks via cables that are behind the column. The connectors for these cables are snapped into a connector adapter, which is snapped in holes 45 but which will be described later, which then is in turn mounted from the rear to the column 46. The Column 46 is longer than the total height of the blocks in order to accommodate an area where the connectors for the 'start' of the cabling are mounted. The column 46 is available in various lengths to accommodate 1–7 I/O Blocks. Another variation of the column is for horizontal redundancy, where the column is wider by one Block and also comes in various lengths.

Figure 21:
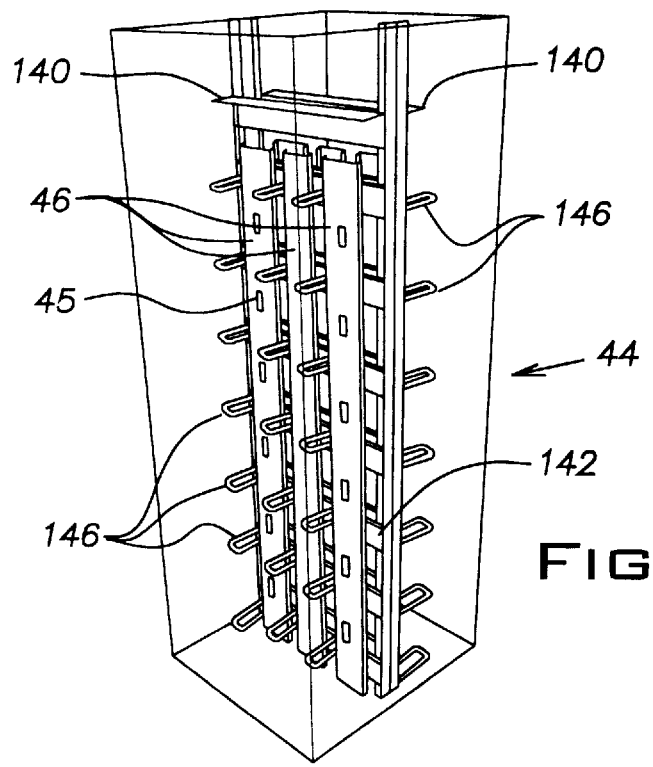
FIG. 21. shows cable carriers in the FIG. 20 cabinet
Figure 22:
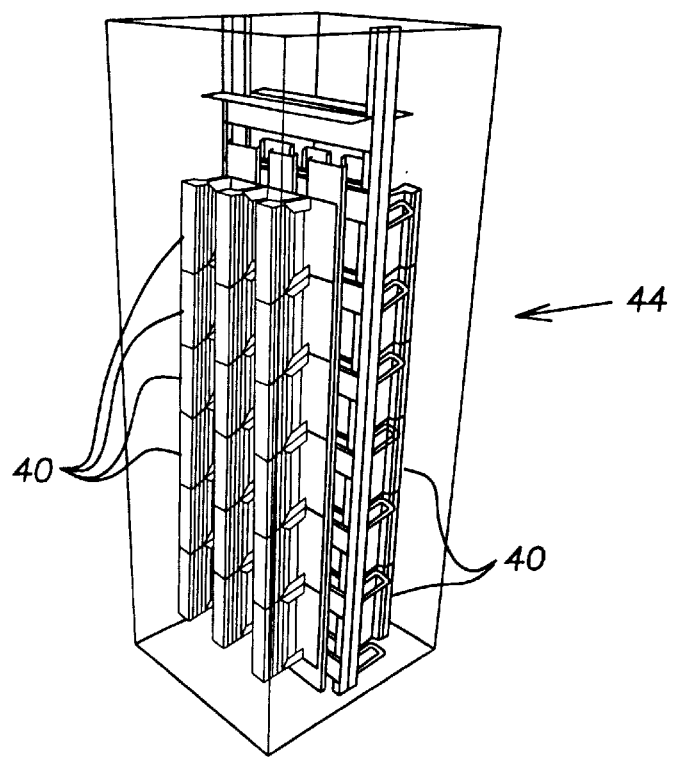
FIG. 22. shows a plurality of terminal blocks mounted in the FIG. 21 cabinet.
Figure 23:
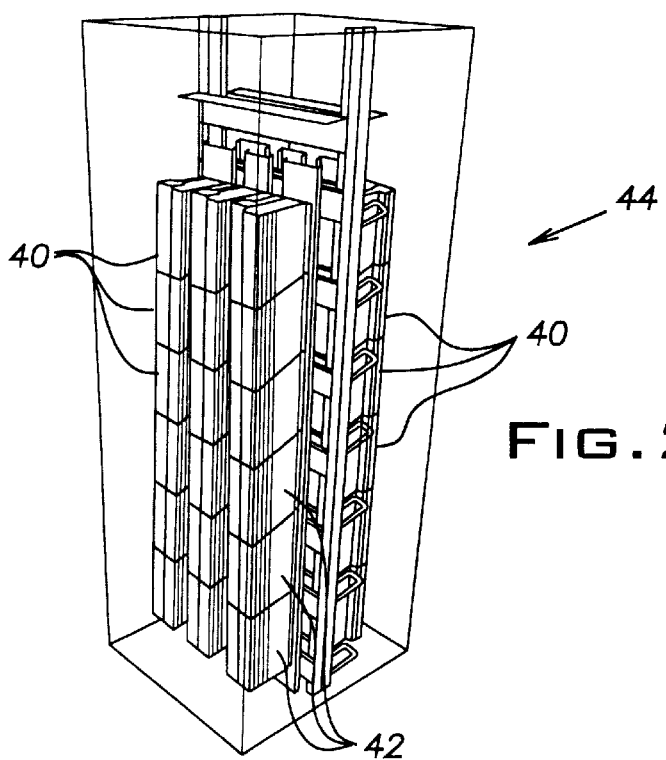
FIG. 23. shows the block I/O's mounted to the terminal blocks of FIG. 22.
Figure 24:
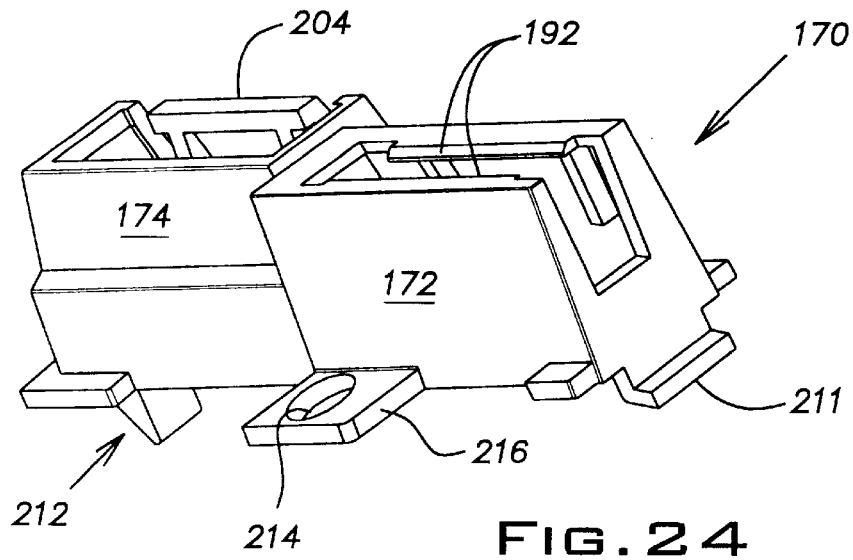
FIG. 24. is a perspective top view of the electrical connector of the present invention having power and signal connecting holders therein.
Figure 25:
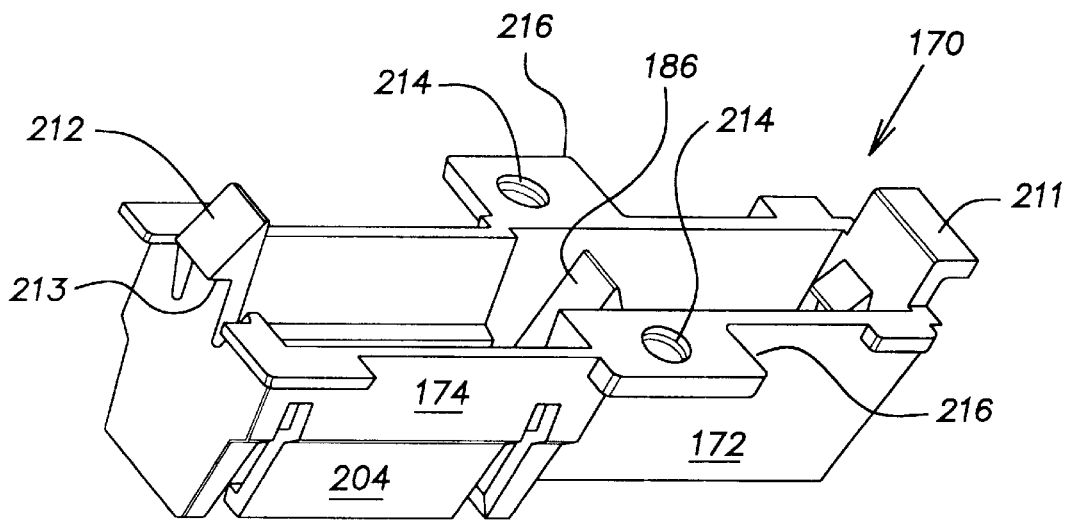
FIG. 25. is a perspective bottom view of the power and signal connecting holders of the FIG. 24. assembly.

As seen in FIG. 21. a series of wire retainers 146 are mounted to the horizontal supports 142 thus making it very easy to accommodate a varying length column 46. It also makes it very easy for the ultimate user to adapt his system to the cabling environment Next, as is shown in FIG. 22., the terminal block 40 are now fastened securely to the columns 46 with two screws located at the backplane cover area thereof. Next the proper I/O unit 42 is engaged to the proper processor block 40 in a manner described earlier and as best seen in FIG. 23.

As was mentioned, the conductive column 46 has connectors mounted into openings 74 formed on a connector wall thereof which provide power and signal connections respectively from the cabinet 44 to the I/O module 42 of the block I/O assembly 38. A pair of alignment pins 50 found on the back of the I/O base or connector unit 40, When the unit 40 is mounted in the cabinet 44 the alignment pins 50 align the I/O unit through an opening 52 formed therein. This opening 52 matches an opening 55 found on the back of the I/O module 42 which has individual dustered power and signal pins 57, 59 which mate with an appropriate power and signal connections as will be explained later. The power pins 57 on the I/O module 42 will be electrically connected to the cabinet 44 before any signal pins 59 are connected to the cabinet by the proper mounting of the module 42 to the connector 40 into the I/O block assembly 38.

To provide a blind fit electrical connection of the I/O module 38 which will also provide a sequential connection of the power signals 57 to the module before any signal 59 inputs thereto, a unique power and signal holder assembly 170 is used to mount the I/O block to the power and signal sources 46 in the cabinet 44. As seen in FIGS. 24–29, the holder assembly 170 is made from polycarbonate material to have a lower signal 59 cable holding area 172 and a power 57 holding area 174 elevated from the signal area 172.

A signal 59 ribbon connector 176 is connected to a end cap 178 which provides electrical conduction from he individual ribbon 176 signal lines to a plurality of electrical connecting openings 180 in a well known manner. The cap 178 has a detented section 182 on both ends. This signal assembly 184 is mounted into the holder 170 section by pressing back a flexible inner wall 186 having a hooked section 188 to allow the detente 182 to slide along a matching protrusion wall 190 inside the section 172 until the hook section 188 snaps back across the bottom of the cap 178 holding the signal assembly firmly therein. Wall sections 192 extend over the cap 178 in the signal area 174 to effectively capture the signal assembly between these wall sections 192 and the hooked area 188.

A power signal assembly 194 has six electrical lead wires 196 individually connected to six electrical apertures 198 formed in a cap assembly 200 to provide electrical conduction from the wires 196 to the apertures 198 in a known manner. The assembly 200 also has a series of extending tips 202. The power assembly 194 is fitted into the section 174 of the holder 170 by pushing the top of the assembly 194 into the section 174 against the flexible wall section until the sections or teeth 202 of the assembly lock on the top of wall 204. A rib 206 formed on the back of the assembly 194 then rests against a wall 208 formed in the holder 170 to prevent any further upward movement of the assembly 194 in the area 172.

As best seen in FIG. 29 the holder is mounted into the enlarged opening area 45 formed on a connector wall 210 of the column 46 of the cabinet 44 which provides power and signal connections from the cabinet 44 to the ribbon connectors 176 and the power wires 196. The holder 170 is mounted to this area by tilting an extended rigid ear section 211 formed on one end of the holder 170 into the opening 209 to extend under the wall section 210 and then snapping a flexible ear sections 212 formed on the end of the holder opposite the ear section 211 through the opening 209 to catch under the wall section 210. The opening 209 is slightly wider than the connector 170 providing a loose sideways fit. Also, the flexible member 212 by virtue of its flexibility and the width of the extended tip 213 allows lateral movement of the assembly 170 in the opening 209 to thus provide a blind fit of the I/O module which will compensate for tolerance buildup during assembly of the component parts.

The holder 170, also has a pair of enlarged openings 214 formed through wing sections 216 located along the section 172 of the holder 170. These openings act as alignment holes for a pair of alignment pins 218 found on the back of the I/O base or connector unit 40. When the unit 40 is mounted to the wall 210 of the cabinet 44 the alignment pins being smaller than the opening 214 will grossly align the holder 170 to be oriented with an opening 220 formed therein. This opening matches an opening 19 found on the back of the I/O module 42 which has individually clustered power and signal pins 76–78 which mate with the holes 198, 180 found on the cap assemblies 184, 194. Since the power assembly 194 is maintained higher than the signal assembly 184 when both are mounted in the holder 170, the power pins 224 on the I/O module 42 will be electrically connected to the cabinet before any signal pins 226 are connected to the cabinet by the proper mounting of the module 42 to the connector 40 into the I/O block assembly 38.

It will be understood that certain improvements and additions which would be obvious to one of ordinary skill in this art area have been deleted herein for the sake of conciseness and readability but all such are intended to fall within the scope of the following claim

What is claimed is:

1. A block I/O assembly comprising:
   a processing block having an L-shaped housing assembly having the lower section mountable to a mounting member of an I/O system cabinet and the end of the top section fitted with a series of field wiring connections;
   an I/O block mountable to the lower section of said processing block to be electrically connected to said field wiring connections and in turn being electrically connectable to said I/O system cabinet to receive and communicate field signals thereto; and
   wherein said field wiring connection of said processing block includes a series of field wiring inputs mounted in two columns on the front face thereof with an identification strip mounted there between identifying each input.

2. An assembly as set forth in claim 1 including an electrical ribbon cable connecting said field wiring inputs to a circuit board mounted on the lower leg section of said housing.

3. A block I/O assembly comprising:
   a processing block having an L-shaped housing assembly having the lower section mountable to a mounting member of an I/O system cabinet and the end of the top section fitted with a series of field wiring connections;
   an I/O block mountable to the lower section of said processing block to be electrically connected to said field wiring connections and in turn being electrically connectable to said I/O system cabinet to receive and communicate field signals thereto;
   said field wiring connection of said processing block including a series of field wiring inputs mounted in two columns on the front face thereof with an identification strip mounted there between identifying each input;
   an electrical ribbon cable connecting said field wiring inputs to a circuit board mounted on the lower section of said housing; and
   a grounding plate mounted along the L-shaped housing to enclose said ribbon cable therein.

4. An assembly as set forth in claim 3 wherein said I/O block includes a backplane cover mountable to the leg section of said housing and having a series of circuit boards mounted thereto and a cover with open ends for enclosing said circuit boards while allowing air circulation to pass through the open ends thereof.

5. An assembly as set forth in claim 4 including a pair of grille covers for said open ends of said U-shaped cover.

6. An assembly as set forth in claim 5 including a series of color codes located on an external surface of said process or block and said I/O block to identify matching units.

7. An assembly as set forth in claim 6 including a series of identifying abbreviations located on said external surface of said processor block and said I/O block to identify type of signals processed.

8. A assembly as set forth in claim 7 wherein said identifying abbreviations are:

A=Analog

D=Digital

C=Combined.

9. A assembly as set forth in claim 8 wherein said identifying abbreviations also identify the signals as being input or output by the abbreviations I=Input O=Output.

10. A assembly as set forth in claim 9 wherein said block I/O assembly includes a plurality of processing blocks and I/O blocks and wherein only identically color coded and abbreviated processing blocks and I/O blocks are connected to each other.

* * * * *